United States Patent
Ai et al.

(10) Patent No.: US 11,965,101 B2
(45) Date of Patent: Apr. 23, 2024

(54) THREE-DIMENSIONAL DYE, MANUFACTURING METHOD OF THREE-DIMENSIONAL DYE AND PHOTORESIST MIXTURE

(71) Applicant: TCL China Star Optoelectronics Technology Co., Ltd., Guangdong (CN)

(72) Inventors: Lin Ai, Guangdong (CN); Hong Meng, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 707 days.

(21) Appl. No.: 17/251,872

(22) PCT Filed: Sep. 3, 2020

(86) PCT No.: PCT/CN2020/113255
§ 371 (c)(1),
(2) Date: Dec. 14, 2020

(87) PCT Pub. No.: WO2022/032757
PCT Pub. Date: Feb. 17, 2022

(65) Prior Publication Data
US 2022/0275212 A1  Sep. 1, 2022

(30) Foreign Application Priority Data
Aug. 11, 2020 (CN) .......................... 202010798716.6

(51) Int. Cl.
*G03F 7/033* (2006.01)
*C09B 47/16* (2006.01)

(52) U.S. Cl.
CPC .............. *C09B 47/16* (2013.01); *G03F 7/033* (2013.01)

(58) Field of Classification Search
None
See application file for complete search history.

(56) References Cited

U.S. PATENT DOCUMENTS

2017/0069691 A1* 3/2017 Iwata ...................... C09B 47/24

FOREIGN PATENT DOCUMENTS

KR        20170064178 A  *  6/2017  ............. G03F 7/027

OTHER PUBLICATIONS

Zhang et al, Lone-Pair Delocalization Effects within Electron Donor Molecules: The Case of Triphenylamine and Its Thiophene-Analog, J. Phys. Chem. C 2018, 122, 31, 17706-17717 (Year: 2018).*
Translation of Kim (Year: 2017).*

* cited by examiner

*Primary Examiner* — Mark F. Huff
*Assistant Examiner* — Andrew Preston Traywick

(57) ABSTRACT

A three-dimensional dye, a manufacturing method of the three-dimensional dye, and a photoresist mixture are disclosed. A non-planar three-dimensional dye molecular structure is constructed by adding a three-dimensional structure group into a dye molecule, thereby breaking the strong attraction force between the planar conjugation of the dye molecule. Aggregation of dye molecules are prevented, influence of dye molecules on optical paths is eliminated, and thus optical properties and color rendering properties of color filters made by a photoresist liquid are improved.

20 Claims, 1 Drawing Sheet

THREE-DIMENSIONAL DYE, MANUFACTURING METHOD OF THREE-DIMENSIONAL DYE AND PHOTORESIST MIXTURE

RELATED APPLICATIONS

This application is a National Phase of PCT Patent Application No. PCT/CN2020/113255 having International filing date of Sep. 3, 2020, which claims the benefit of priority of Chinese Patent Application No. 202010798716.6 filed on Aug. 11, 2020. The contents of the above applications are all incorporated by reference as if fully set forth herein in their entirety.

FIELD AND BACKGROUND OF THE INVENTION

The present disclosure relates to the field of display technologies, and more particularly, to a three-dimensional dye, a manufacturing method of the three-dimensional dye, and a photoresist mixture.

In general, color-rendering materials for color resist solutions of color photoresist are dye molecules. Most of the current dye structures being mass-produced are planar macrocyclic conjugated molecular materials. Molecules in the planarized macrocyclic conjugated system tend to aggregate due to a relatively large interaction force between each other during dispersion processes. Therefore, optical properties and color rendering performance are affected.

SUMMARY OF THE INVENTION

Technical Problems

Embodiments of the present disclosure provide a three-dimensional dye molecule, a manufacturing method of the three-dimensional dye molecule, and a mixture of photoresist solution. Construction of a non-planar three-dimensional structure effectively facilitates to disperse macrocyclic conjugated dye molecules in the photoresist solution, which improve the optical properties and color rendering properties of prepared color filters made by the photoresist solution.

The present disclosure provides a three-dimensional dye, comprising:
wherein a structural formula of the three-dimensional dye is $R_a$-$R_b$, wherein a structural formula of the $R_a$ group is

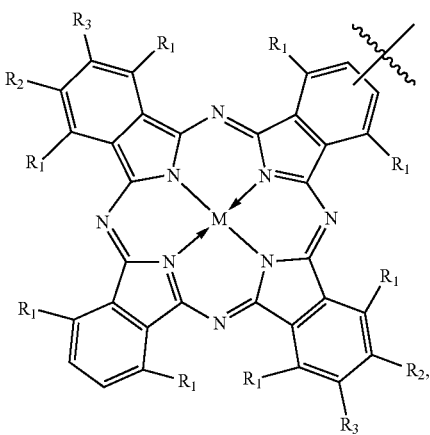

and a structural formula of the $R_b$ group is any one of

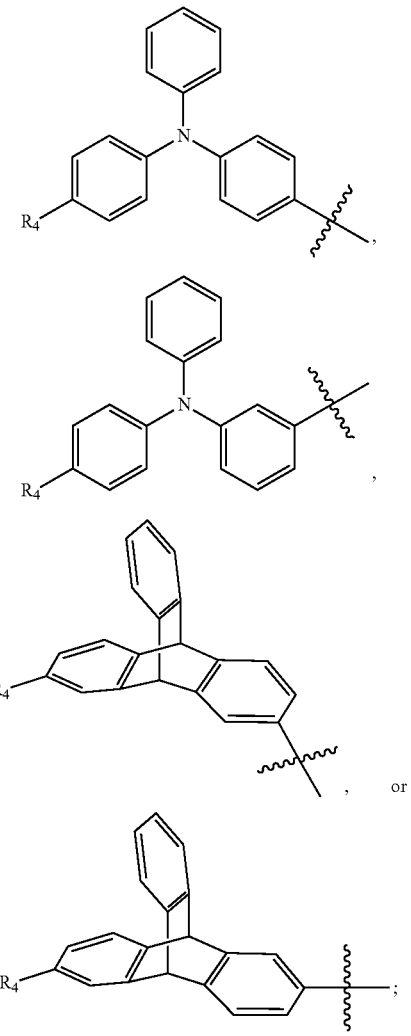

and wherein M is any one of Zn, Cu, Ni, Co, or Fe, and $R_1$ group, $R_2$ group, $R_3$ group and $R_4$ group are each any one of hydrogen group, halogen group, ketone group, aldehyde group, carboxyl group, alkyl group, sulfonate group, nitrate group, or ether bond.

In some embodiments, a structural formula of the $R_4$ group is any one of

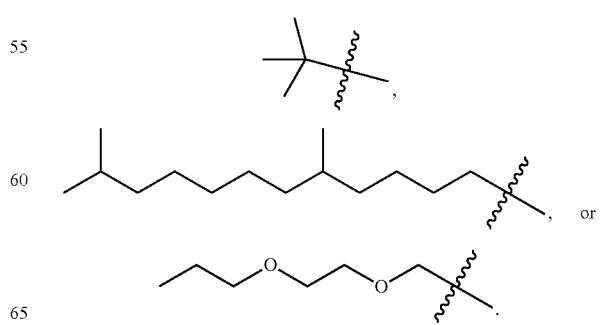

In some embodiments, the structural formula of the $R_a$ group is any one of

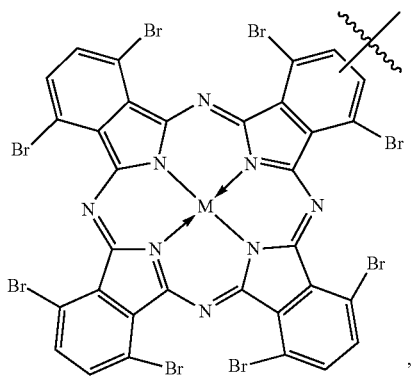

,

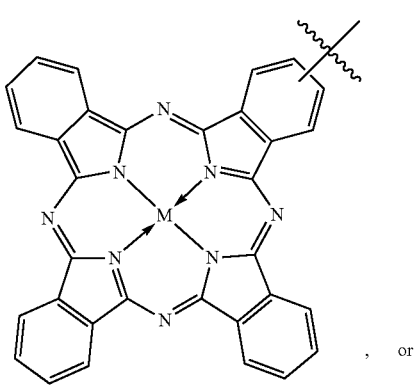

, or

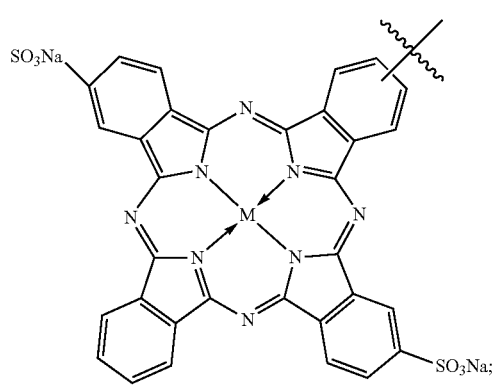

;

and wherein M is any one of Zn, Cu, Ni, Co, or Fe.

An embodiment of the present disclosure provides a manufacturing method of a three-dimensional dye, comprising steps of:

providing a first reactant, the first reactant is a compound comprising an $R_a$ group, a structural formula of the $R_a$ group comprises

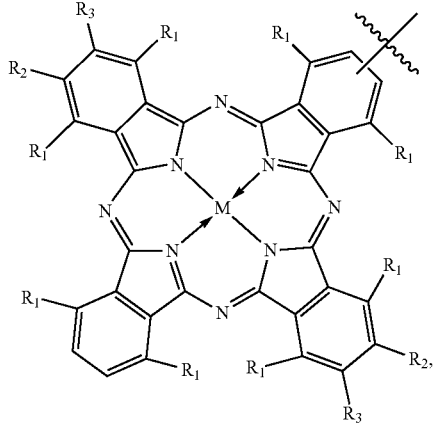

wherein $R_1$ group, $R_2$ group, and $R_3$ group are each any one of hydrogen group, halogen group, ketone group, aldehyde group, carboxyl group, alkyl group, sulfonate group, nitrate group, or ether bond, and wherein M is any one of Zn, Cu, Ni, Co, or Fe;

providing a second reactant, the second reactant is a compound comprising an $R_b$ group, a structural formula of the $R_b$ group comprises any one of

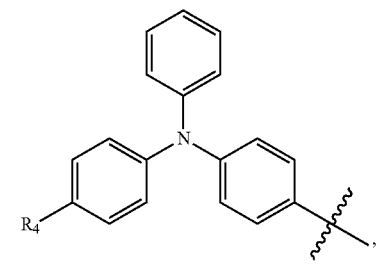

,

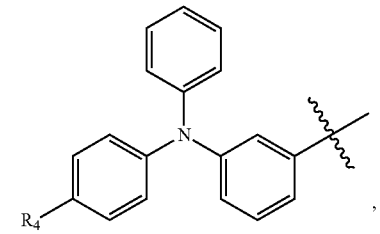

,

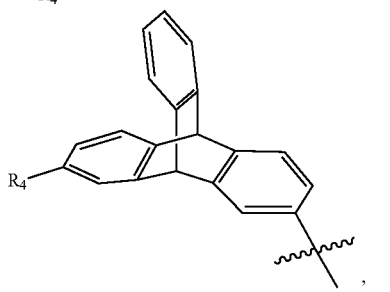

, or

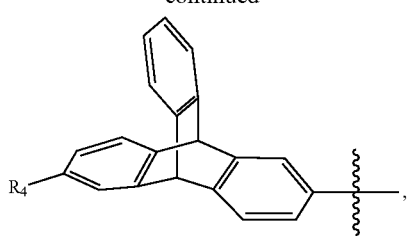

wherein $R_4$ group is any one of hydrogen group, halogen group, ketone group, aldehyde group, carboxyl group, alkyl group, sulfonate group, nitrate group, or ether bond; and reacting the first reactant with the second reactant to produce a three-dimensional dye, wherein a structure formula of the three-dimensional dye is $R_a$-$R_b$.

In some embodiments, the step of providing the first reactant further comprises:

providing a first precursor, wherein the first precursor is reacted to obtain the first reactant; and wherein a structural formula of the first precursor is

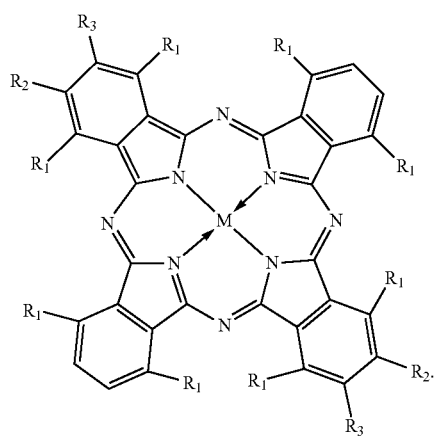

In some embodiments, the first precursor is reacted in a first solvent having a first additive to obtain the first reactant; wherein the first solvent comprises one of ester solvent, ether solvent, halogenated hydrocarbon solvent, alcohol solvent, amide solvent, halogenated alkane solvent, or a combination thereof, and the first additive comprises phosphorous chloride.

In some embodiments, a structural formula of the first precursor is

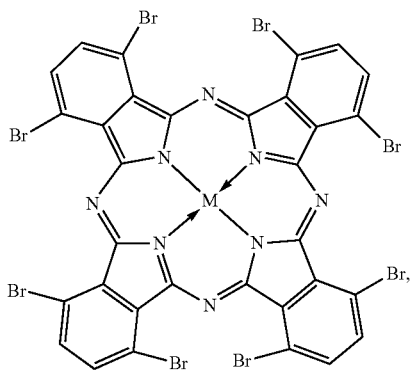

the first solvent is N,N-dimethylformamide (DMF), and the first additive is phosphorus oxychloride.

In some embodiments, the step of providing the second reactant further comprises:

providing a second precursor, wherein the second precursor is reacted to obtain the second reactant;

wherein a structural formula of the second precursor is

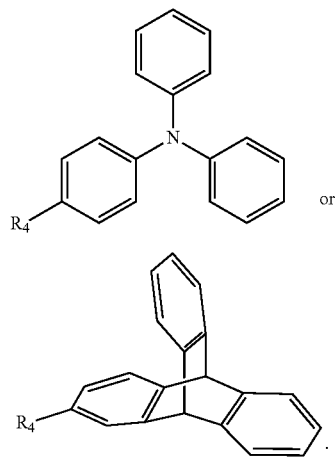

In some embodiments, the second precursor is reacted in a second solvent having a second additive to produce the second reactant; wherein the second precursor is reacted in a second solvent having a second additive to obtain the second reactant; wherein the second solvent comprises one of ester solvent, ether solvent, halogenated hydrocarbon solvent, alcohol solvent, amide solvent, halogenated alkane solvent, or a combination thereof, and the second additive comprises one of phosphorous chloride, borohydride, phosphorus compound, or a combination thereof.

In some embodiments, the second additive comprises any one of phosphorus oxychloride, sodium borohydride, triphenylphosphine dibromide, or a combination thereof.

In some embodiments, the structural formula of the second precursor is

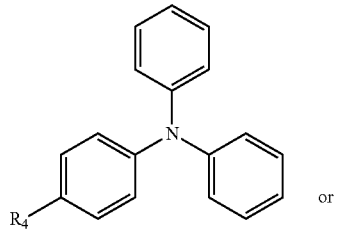

or

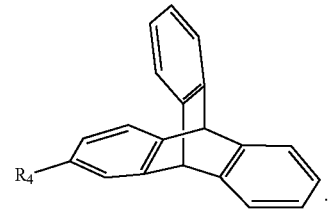

.

In some embodiments, the first reactant and the second reactant are reacted in a third solvent having a catalyst to obtain the third reactant; wherein the third solvent comprises one of ester solvent, ether solvent, halogenated hydrocarbon solvent, alcohol solvent, amide solvent, halogenated alkane solvent, or a combination thereof, and the catalyst comprises a basic type catalyst.

An embodiment of the present disclosure provides a photoresist mixture, comprising: a three-dimensional dye, an adhesive resin, a photoinitiator, a polymerizable monomer, a solvent, and an adjuvant, wherein a structural formula of the three-dimensional dye is $R_a$-$R_b$, wherein a structural formula of the $R_a$ group is

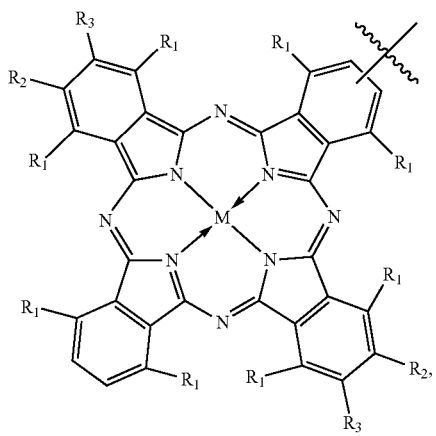

and a structural formula of the $R_b$ group is any one of

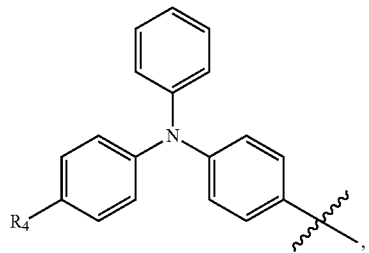

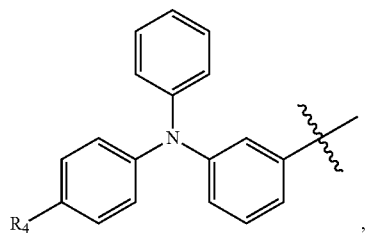

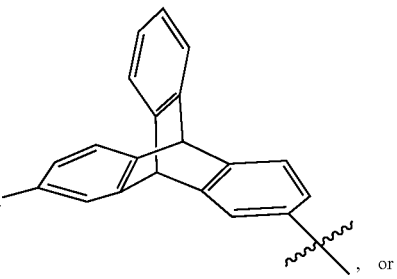

, or

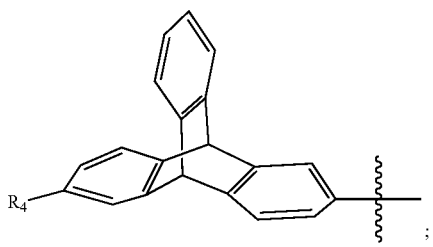

;

wherein M is any one of Zn, Cu, Ni, Co, or Fe, and $R_1$ group, $R_2$ group, $R_3$ group, and $R_4$ group are each any one of hydrogen group, halogen group, ketone group, aldehyde group, carboxyl group, alkyl group, sulfonate group, nitrate group, or ether bond.

In some embodiments, the structural formula of the $R_4$ group is any one of

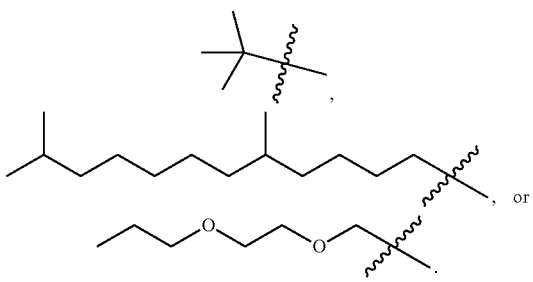

.

In some embodiments, the structural formula of the $R_a$ group is any one of

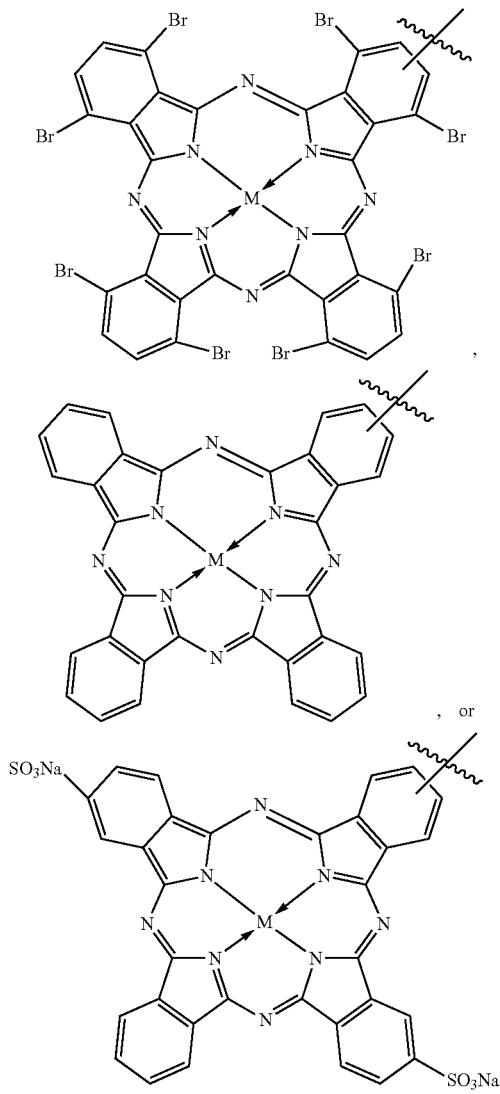

, or and wherein M is any one of Zn, Cu, Ni, Co, or Fe.

In some embodiments, a mass percentage of the three-dimensional dye is 10%-16%, a mass percentage of the adhesive resin is 5%-8%, and a mass percentage of the photoinitiator is 0.2%-0.6%, a mass percentage of the polymerizable monomer is 5%-8%, a mass percentage of the solvent is 70%-80%, and a mass percentage of the adjuvant is 0.1%-0.2%.

In some embodiments, the adhesive resin is acrylic resin, the photoinitiator is a benzophenone compound, and the polymerizable monomer is acrylate of polyhydric alcohol, and the solvent is propylene glycol methyl ether acetate.

In some embodiments, the adjuvant comprises one of dispersant, leveling agent, thermal polymerization inhibitor, foam inhibitor, or a combination thereof.

In some embodiments, the adjuvant is a dispersant, and the dispersant is a polystyrene-polyacrylic acid di-block copolymer material.

Beneficial Effects:

The embodiments of the present disclosure provide a three-dimensional dye, a manufacturing method of a three-dimensional dye, and a photoresist mixture. A non-planar three-dimensional dye molecular structure is constructed by adding a three-dimensional structure group into a dye molecule, thereby breaking the strong attraction force between the planar conjugations of the dye molecules, and preventing the dye molecules from aggregation, such that the dye molecules form a single molecular state in the photoresist solution, which facilitates the macrocyclic conjugated dye molecules to disperse in the photoresist solution and eliminates its influence on optical paths. Optical properties and color rendering properties of color filters made by the photoresist solution are improved.

BRIEF DESCRIPTION OF THE SEVERAL
VIEWS OF THE DRAWINGS

In order to illustrate technical solutions in the embodiments or in the prior art more clearly, the accompanying drawings required in the description of the embodiments or the prior art are introduced briefly hereafter. It is obvious that the accompanying drawings in the following description are merely part of the embodiments of the present disclosure. People with ordinary skills in the art can obtain other drawings without making inventive efforts.

Figure 1:
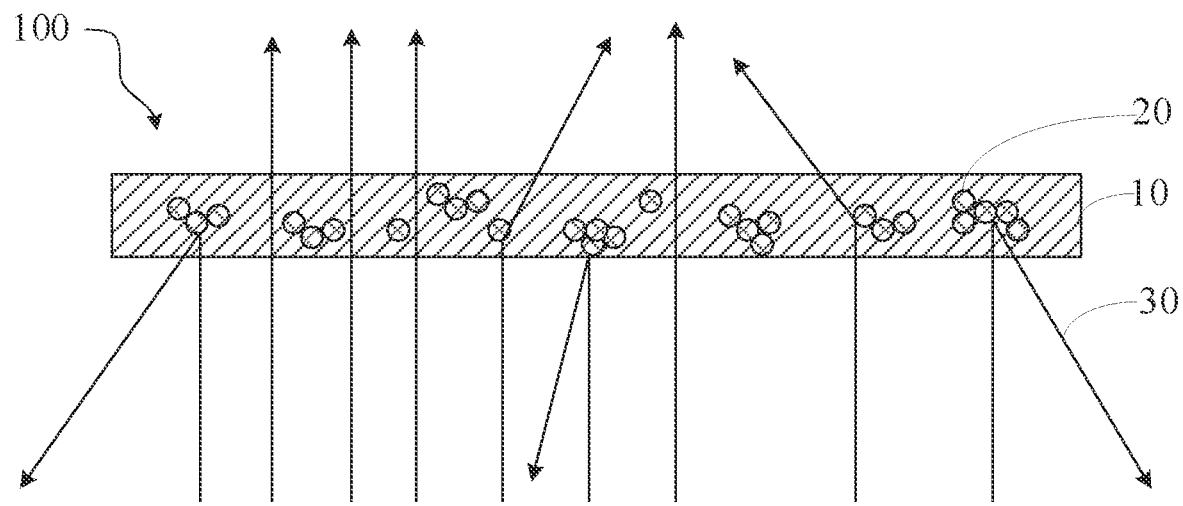
FIG. 1 is a schematic diagram of a structure of a color filter in the related art.

DESCRIPTION OF SPECIFIC EMBODIMENTS
OF THE INVENTION

The technical solutions of the embodiments of the present disclosure will be illustrated completely and clearly in combination with the following drawings of the embodiments of the disclosure. Apparently, the described embodiments are merely a few rather than all of the embodiments of the present disclosure. All other embodiments obtained by persons of ordinary skill in the art based on the embodiment of the present disclosure without creative efforts shall fall within the protection scope of the present disclosure.

It should be noted that in the description of the present disclosure, it should be understood that orientations or positional relationships the terms indicated by "upper", "lower", "front", "rear", "left", "right", "inner", "outer", etc. are based on the orientations or positional relationships shown in the drawings, and is only for the convenience of describing the present disclosure and simplifying the description, rather than indicates or implies that the device or element must have a specific orientation or being constructed and operated by a specific orientation. Therefore, it should not be regarded as a limitation of the present disclosure.

The embodiments of the present disclosure provide a three-dimensional dye, a manufacturing method of the three-dimensional dye, and a photoresist mixture. The three-dimensional dye is described in detail below.

The present disclosure provides a three-dimensional dye, a structural formula of the three-dimensional dye is $R_a$-$R_b$, wherein a structural formula of the $R_a$ group is

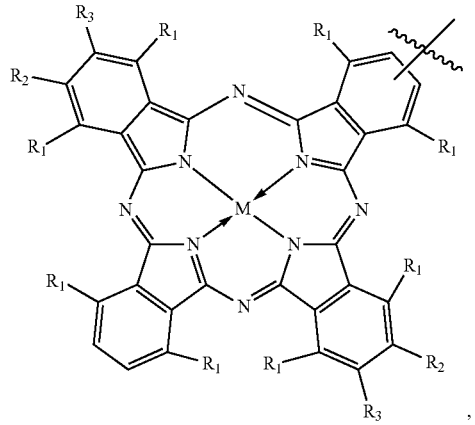

and a structural formula of the $R_b$ group is any one of

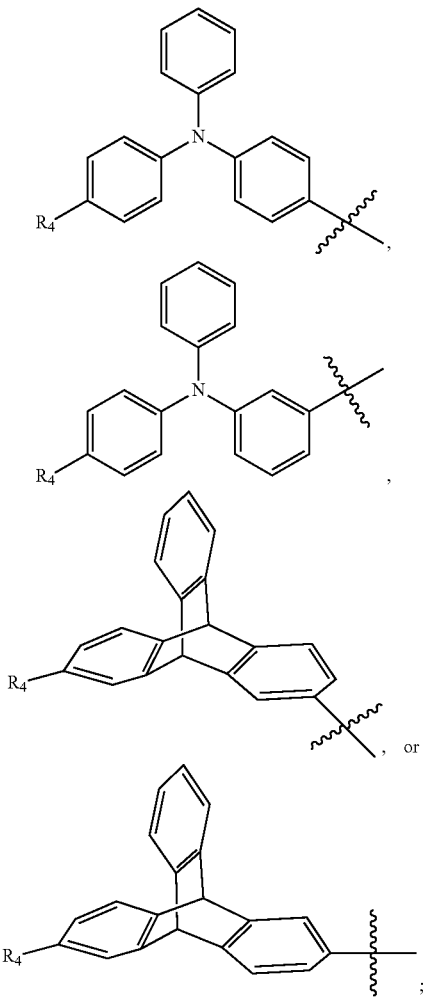

and
wherein M is any one of Zn, Cu, Ni, Co or Fe, and $R_1$ group, $R_2$ group, $R_3$ group and $R_4$ group are each any one of hydrogen group, halogen group, ketone group, aldehyde group, carboxyl group, alkyl group, sulfonate group, nitrate group, or ether bond.

Specifically, a structural formula of the $R_4$ group is any of

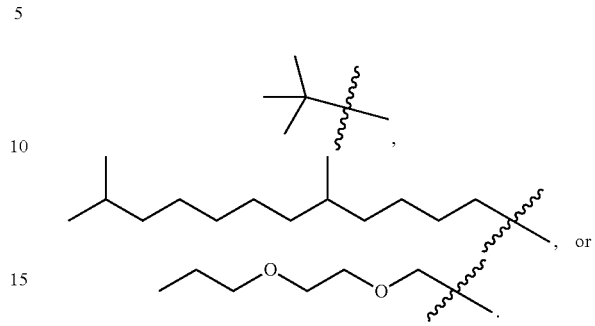

Specifically, the structural formula of the $R_a$ group can be any of

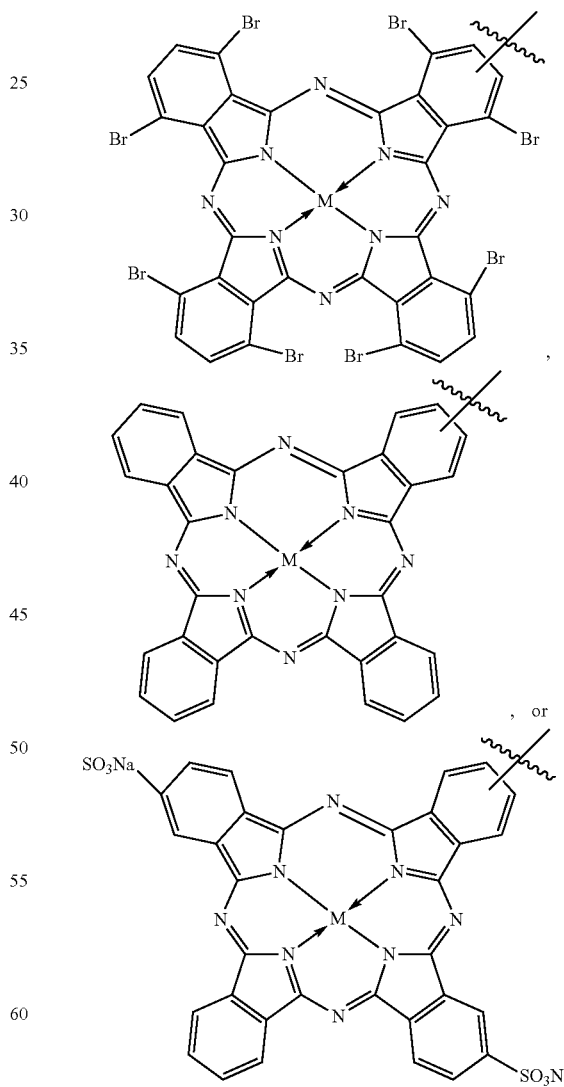

and wherein M is any one of Zn, Cu, Ni, Co, or Fe.

The three-dimensional dye provided by the present disclosure constructs a non-planar three-dimensional dye molecular structure by adding three-dimensional structural groups to the dye molecule. On one hand, the type of three-dimensional substituent groups is adjusted to adjust chromaticity. On the other hand, the strong attraction force between the planar conjugated structures of the dye molecule is effectively broken. Aggregation of dye molecules is prevented. The dye molecules form a single molecular state in the photoresist solution and facilitates the macrocyclic conjugated dye molecules to disperse in the photoresist solution. The influence of the dye molecules on optical paths is eliminated. Optical properties and color rendering properties of the color filter made by the photoresist solution are improved.

The present disclosure provides a manufacturing method of a three-dimensional dye, including steps of:

step 101, providing a first reactant, the first reactant is a compound comprising an $R_a$ group, a structural formula of the $R_a$ group comprises

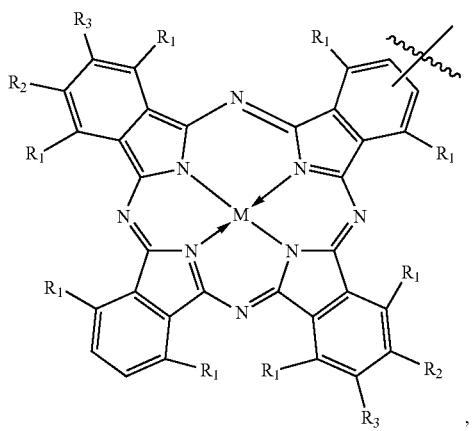

where M is any one of Zn, Cu, Ni, Co, or Fe. $R_1$ group, $R_2$ group, and $R_3$ group are each any one of hydrogen group, halogen group, ketone group, aldehyde group, carboxyl group, alkyl group, sulfonate group, nitrate group, or ether bond.

In some embodiments, the step of providing the first reactant further includes the following:

providing a first precursor, wherein the first precursor is reacted to obtain the first reactant.

A structural formula of the first precursor

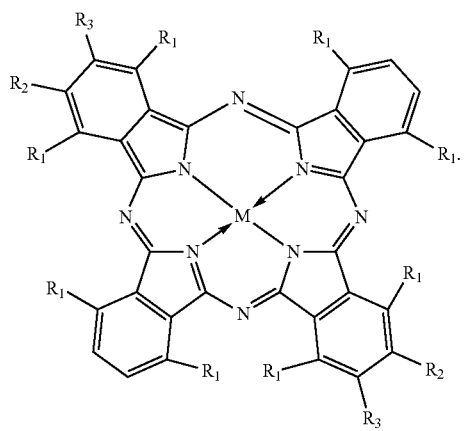

In some embodiments, the first precursor is reacted in the first solvent to obtain the first reactant, and the first solvent has the first additive; wherein the first solvent includes ester solvents, ether solvents, and halogenated hydrocarbons. One or more combinations of solvents, alcohol solvents, amide solvents, and halogenated alkane solvents, and the first additive includes phosphorous chloride.

In one embodiment, a structural formula of the first precursor is the first precursor 1

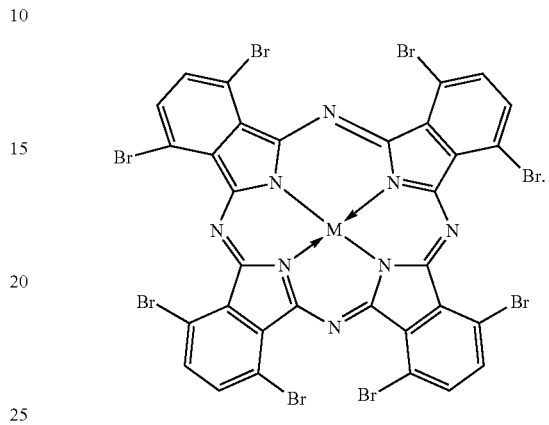

The first solvent is N,N-dimethylformamide (DMF). The first additive is phosphorus oxychloride. A structural formula 2 of the first reaction is

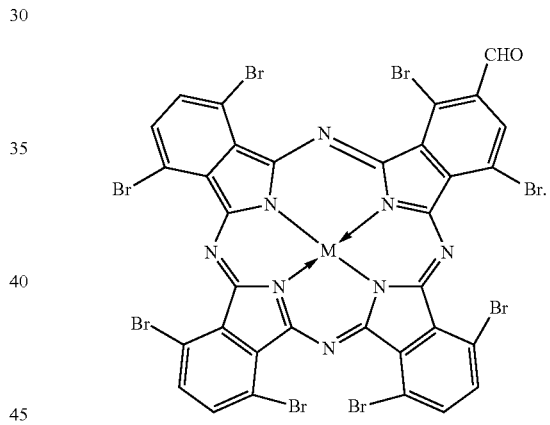

A reaction equation that the first precursor 1 is reacted to obtain the first reactant 2 is as follows:

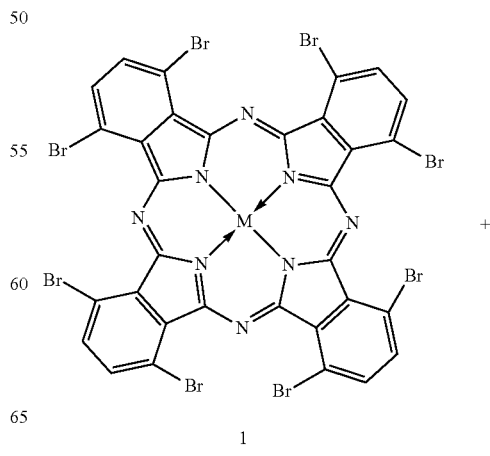

+

1

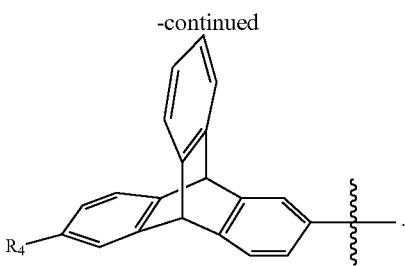

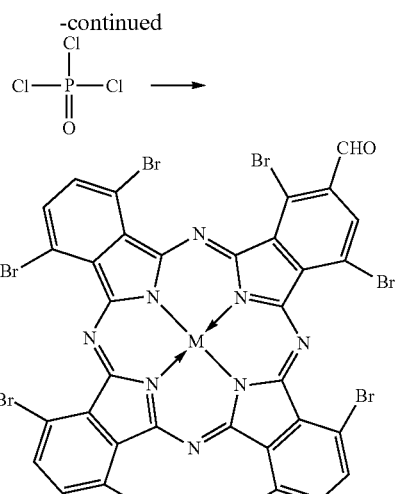

2

Specifically, 20 mmol of the first precursor 1 is dissolved in 30 mL of dry DMF, and then 1 mL of phosphorus oxychloride is added dropwise in the reaction solution, and stirred at 125° C. for one hour. After the reaction is completed, the reaction solution is dissolved in an aqueous solution of sodium acetate, and the product is subjected to column purification using ethyl acetate as an eluent to obtain the first reactant 2. M is any one of Zn, Cu, Ni, Co, or Fe.

Step 102, providing a second reactant. The second reactant is a compound including the $R_b$ group. A structural formula of the $R_b$ group includes any one of

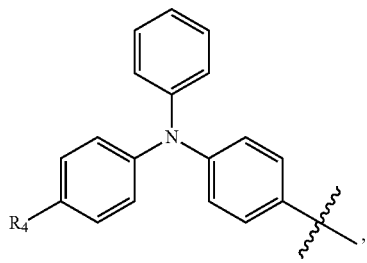,

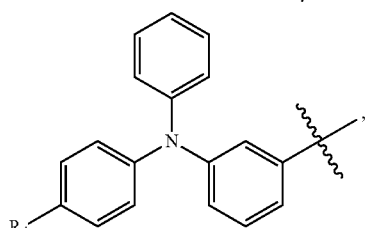,

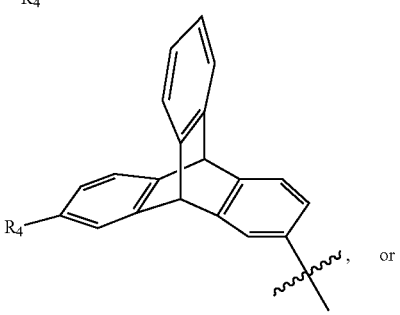, or

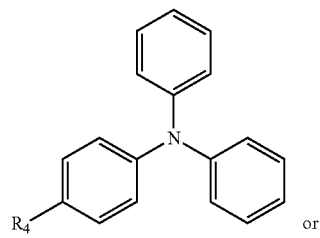

The $R_4$ group is a hydrogen group, halogen group, ketone group, aldehyde group, carboxyl group, alkyl group, sulfonate group, nitrate group, or ether bond.

In some embodiments, the step of providing the second reactant further includes the following:
 providing a second precursor, and the second precursor is reacted to obtain a second reactant.
A structural formula of the second precursor is

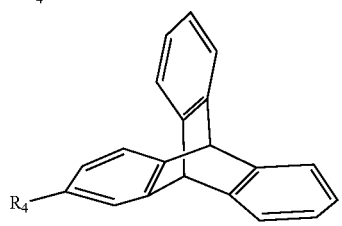 or

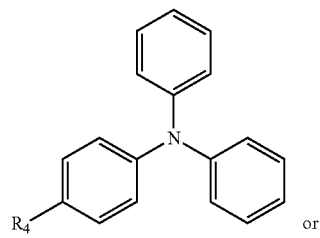.

In some embodiments, the second precursor is reacted in a second solvent having a second additive to produce the second reactant. The second solvent includes one of ester solvent, ether solvent, halogenated hydrocarbon solvent, alcohol solvent, amide solvent, halogenated alkane solvent, or a combination thereof. The second additive comprises one of phosphorous chloride, borohydride, phosphorus compound, or a combination thereof.

In one embodiment, the second precursor is the second precursor

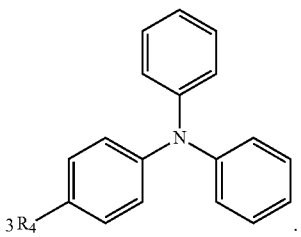.

The second solvent is N,N-dimethylformamide (DMF). The second additive includes phosphorus oxychloride, sodium borohydride, Triphenylphosphine dibromide. A reaction equation that the second precursor 3 is reacted to obtain the second reactant 6 is as follows:

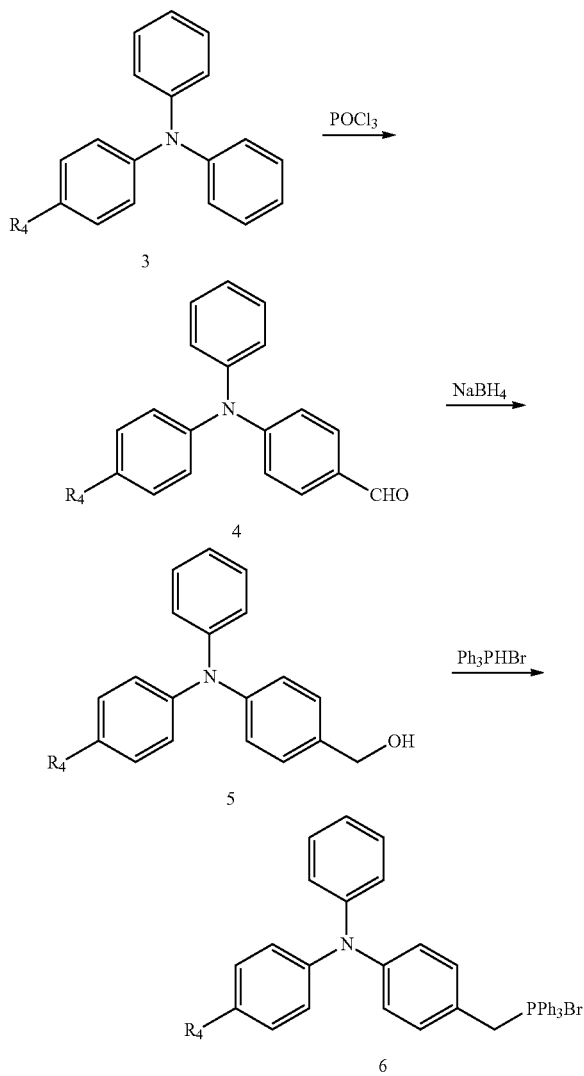

The structural formula of the R$_4$ group is any one of

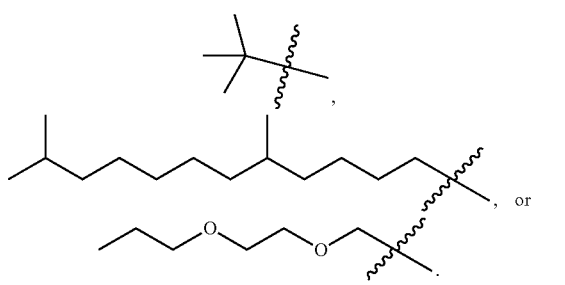

Ph represents a phenyl ring.

Specifically, 33 mmol of the second precursor 3 is dissolved in 30 mL of dry DMF, and then 6 mL of phosphorus oxychloride (POCl$_3$) is added dropwise in the reaction solution, and stirred at 125° C. for one hour. After the reaction is completed, the reaction solution is dissolved in an aqueous solution of sodium acetate, and the product is subjected to column purification treatment using ethyl acetate as an eluent to obtain compound 4.

2.3 mmol of compound 4 is dissolved in a mixed solvent of 15 mL of tetrahydrofuran and 5 mL of methanol and is placed at 0° C. 63.8 mmol of sodium borohydride is dissolved in 1.5 mL of 4% sodium hydroxide aqueous solution and is added dropwise in the above reaction solution and then is stirred at 0° C. for one hour. The product is subjected to column purification using methanol as the eluent for to obtain compound 5.

2.2 mmol of compound 7 is dissolved in 15 mL of dry toluene solvent, then 2.2 mmol of triphenylphosphine dibromide is added, and is stirred at room temperature for 24 hours, and then is subject to column purification using dichloromethane as an eluent to obtain the second reactant 6.

In one embodiment, the second precursor is the second precursor 7

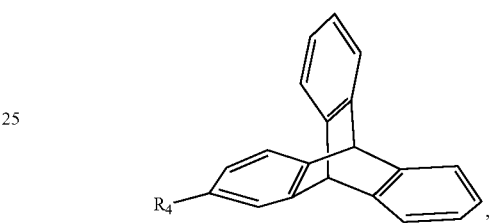

the second solvent is N,N-dimethylformamide (DMF), and the second additive includes phosphorus oxychloride, sodium borohydride, triphenylphosphorus bromide. A reaction equation of the second precursor 7 is reacted to obtain the second reactant 10 is as follows:

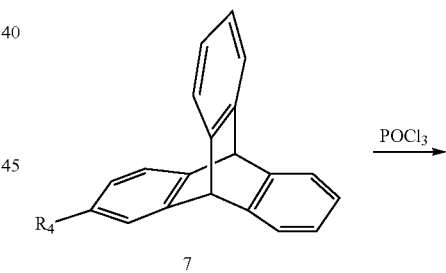

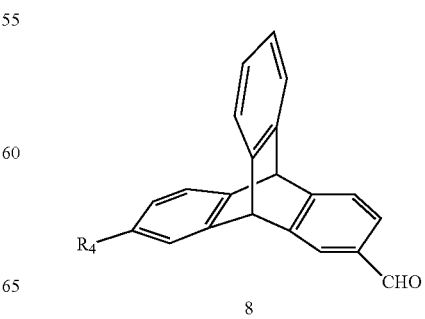

-continued

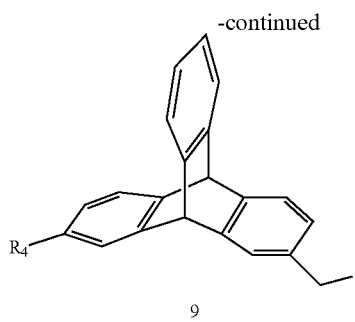

9

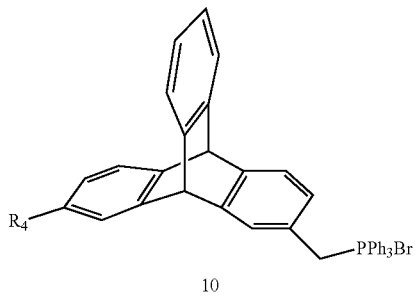

10

A structural formula of the R₄ group is any one of

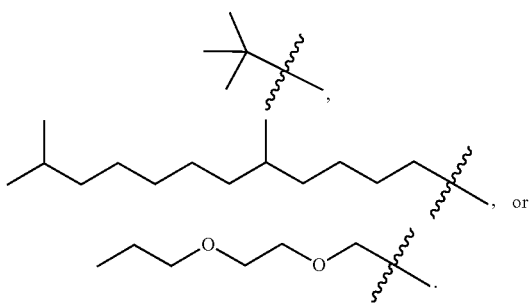

Ph represents a phenyl ring.

Specifically, 33 mmol of the second precursor 7 is dissolved in 30 mL of dry DMF, and then 6 mL of phosphorus oxychloride (POCl₃) is added dropwise to the reaction solution, and stirred at 125° C. for one hour. After the reaction is completed, the reaction solution is dissolved in an aqueous solution of sodium acetate, and is subjected to column purification using ethyl acetate as an eluent to obtain compound 8.

2.3 mmol of compound 8 is dissolved in a mixed solvent of 15 mL of tetrahydrofuran and 5 mL of methanol, place it at 0° C. 63.8 mmol of sodium borohydride is dissolved in 1.5 mL of 4% sodium hydroxide aqueous solution, and add dropwise to the above reaction solution, and is stirred at 0° C. for one hour, and is subjected to column purification using methanol as the eluent to obtain compound 9.

2.2 mmol of compound 7 is dissolved in 15 mL of dry toluene solvent, then add 2.2 mmol of triphenylphosphine dibromide, and is stirred at room temperature for 24 hours, and is then subjected to column purification using dichloromethane as the eluent to obtain the second reactant 10.

Step 103, the first reactant reacts with the second reactant to produce a three-dimensional dye, wherein a structural formula of the three-dimensional dye is $R_a\text{-}R_b$.

In some embodiments, the first reactant and the second reactant react in a third solvent having a catalyst to produce a three-dimensional dye. The third solvent includes ester solvent, ether solvent, halogenated hydrocarbon solvent, alcohol solvent, amide solvent, halogenated alkane solvent, or a combination thereof. The catalyst includes a basic type catalyst.

In one embodiment, the third solvent is chloroform, the first reactant is the first reactant 2, the second reactant is the second reactant 6, and the catalyst is 1,8-diazabicycloundec-7-ene (DBU). The reaction equation that the first reactant 2 reacts with the second reactant 6 to produce the three-dimensional dye 11 is as follows:

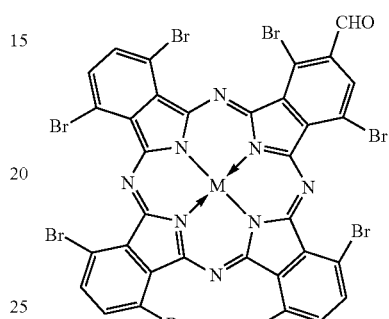

2

+

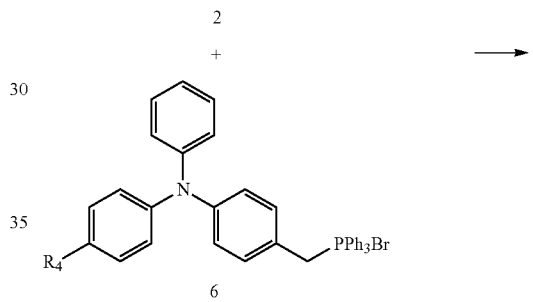

6

⟶

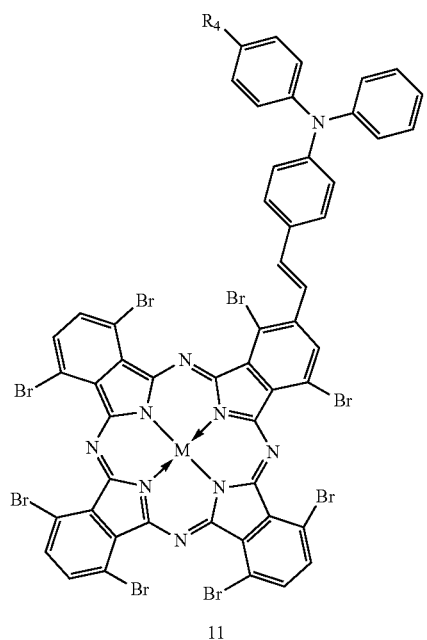

11

The structural formula of the R₄ group is any one of

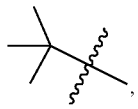

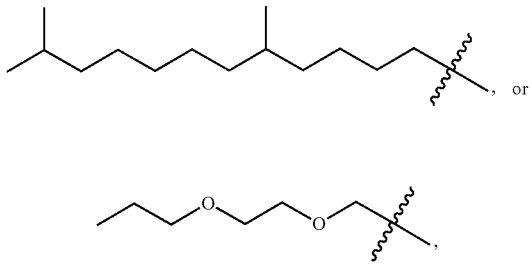

M is any one of Zn, Cu, Ni, Co, or Fe. Ph represents a phenyl ring.

Specifically, 2.7 µmol of the first reactant 2 and 2.7 µmol of the second reactant 6 are dissolved in a dry chloroform solvent. 6.7 µmol of DBU is added and stirred at room temperature for one hour. The product is subjected to a column purification using dichloromethane as the eluent to obtain a crude product. The crude product is dissolved in dichloromethane. 4.05 µmol of elemental iodine is added. After stirring for 24 hours at room temperature, the three-dimensional dye 11 is obtained.

In one embodiment, the third solvent is chloroform, the first reactant is the first reactant 2, the second reactant is the second reactant 10, and the catalyst is 1,8-diazabicycloun-dec-7-ene (DBU). A reaction equation that the first reactant 2 reacts with the second reactant 10 to produce the three-dimensional dye 12 is as follows:

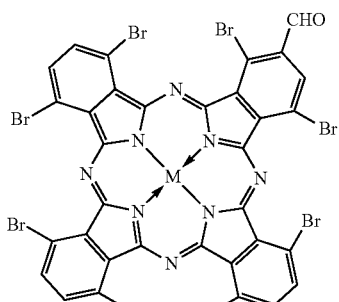

2

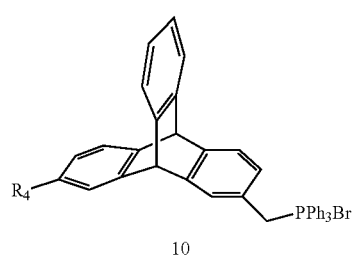

10

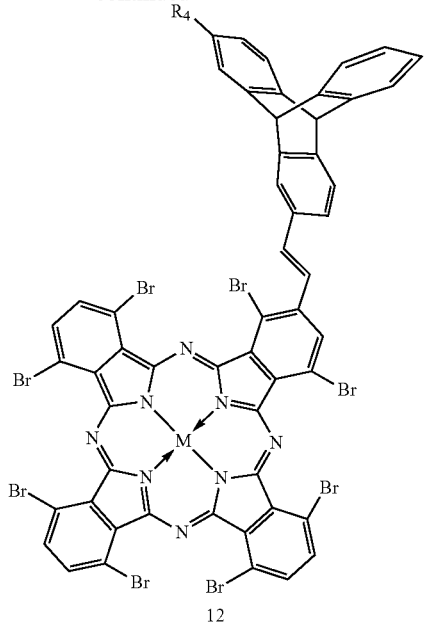

12

The structural formula of the R₄ group is any one of

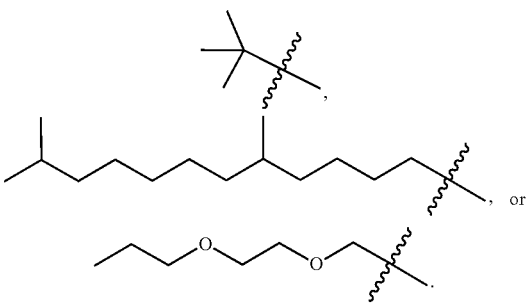

M is any one of Zn, Cu, Ni, Co, or Fe. Ph represents a phenyl ring.

Specifically, 2.7 µmol of the first reactant 2 and 2.7 µmol of the second reactant 10 are dissolved in a dry chloroform solvent, 6.7 µmol of DBU is added and stirred at room temperature for one hour. The product is subjected to a column purification using dichloromethane as the eluent to obtain the crude product. The crude product is dissolved in dichloromethane. 4.05 µmol of elemental iodine is added. After stirring for 24 hours at room temperature, the three-dimensional dye 12 is obtained.

The manufacturing method of the three-dimensional dye provided by the embodiments of the present application employs the second reactant having the three-dimensional structure to react with the first reactant dye molecule to obtain a three-dimensional dye. The manufacturing method is simple. The steps are simple and convenient, and take a short period of time. The chromaticity of the prepared three-dimensional dyes can be adjusted by adjusting the types of three-dimensional substituent groups. Furthermore, the strong attraction force between the planar conjugated structures of the dye molecules is effectively disrupted, and aggregation of dye molecules is prevented. The dye molecules form a single molecular state in the photoresist solution and facilitate the dispersion of the macrocyclic conjugated dye molecules in the photoresist solution. The influence of the dye molecules on optical paths is eliminated. Optical properties and color rendering properties of the color filter made by the photoresist solution are improved.

The embodiments of the present disclosure provide a photoresist mixture, including a three-dimensional dye, an adhesive resin, a photoinitiator, a polymerizable monomer, a solvent, and an adjuvant, wherein the three-dimensional dye is the above-mentioned three-dimensional dye.

In some embodiments, a mass percentage of the three-dimensional dye is 10%-16%. A mass percentage of the adhesive resin is 5%-8%. A mass percentage of the photoinitiator is 0.2%-0.6%. A mass percentage of the polymerizable monomer is 5%-8%. A mass percentage of the solvent is 70%-80%. A mass percentage of the adjuvant is 0.1%-0.2%.

In an embodiment, the adhesive resin is an acrylic resin. The adhesive resin controls mechanical strength of the photoresist mixture by its high polymer molecular weight. The photoinitiator is a benzophenone compound. The photoinitiator forms active free radicals after illumination. The polymerizable monomer is an acrylate of polyhydric alcohol. The polymerizable monomer is used as a crosslinking agent in the photoresist mixture. The solvent is propylene glycol methyl ether acetate (PGMEA). The solvent can be used to adjust the viscosity of the photoresist mixture and improve the coating properties of the photoresist mixture. The adjuvant is polystyrene-polyacrylic acid di-block copolymer (PS-PAA). The polystyrene-polyacrylic acid di-block copolymer (PS-PAA) is used as a dispersant in the photoresist mixture.

The adjuvants also include leveling agents, thermal polymerization inhibitors, and foam inhibitors. Adding different additives can adapt the photoresist mixture to different production requirements.

Please refer to FIG. 1, which is a schematic diagram of a structure of a color filter 100 in the related art. The color filter 100 includes a photoresist solution 10 and a conventional dye 20. In the related art, the color filter 100 is prepared by conventional dyes 20. The conventional dye 20 is a planar macrocyclic conjugated molecular material. The planarized macrocyclic conjugated molecules tend to aggregate due to a relatively large force between each other during dispersion processes of the photoresist solution 10. The light 30 is easily scattered when passing through the color filter 100 which results in a defective display.

Figure 2:
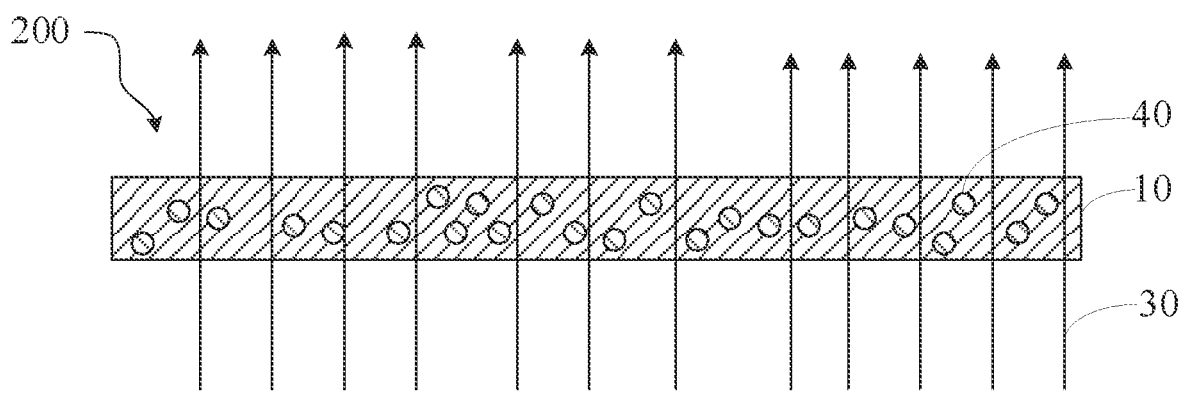
FIG. 2 is a schematic diagram of a structure of a color filter provided by an embodiment of the present disclosure.

Please refer to FIG. 2, which is a schematic diagram of a structure of a color filter 200 provided by an embodiment of the present disclosure. The difference from the related art is that the color filter 200 uses a three-dimensional dye 40. The chromaticity of the three-dimensional dye 40 can be adjusted by adjusting the types of three-dimensional substituent groups. Furthermore, the strong attraction force between the planar conjugated structures of the dye molecule is effectively disrupted. Aggregation of dye molecules is prevented. The dye molecules 40 form a single molecular state in the photoresist solution 10 and facilitates the dispersion the macrocyclic conjugated dye molecules in the photoresist solution 10. The influence of the dye molecules on light paths 30 is eliminated. Optical properties and color rendering properties of the color filter 200 made by the photoresist solution are improved.

The three-dimensional dyes, the manufacturing methods of the three-dimensional dye, and the photoresist mixtures provided by the embodiments of the present disclosure are described in detail above. Specific examples are used herein to describe the principle and implementations of the present disclosure. The descriptions of the foregoing embodiments are merely for understanding the present disclosure. In addition, with respect to the implementations and the application scope, modifications may be made by a person of ordinary skill in the art according to the idea of the present disclosure. Therefore, this specification shall not be construed as a limitation on the present disclosure.

What is claimed is:

1. A three-dimensional dye, wherein a structural formula of the three-dimensional dye is $R_a$-$R_b$, wherein a structural formula of the $R_a$ group is

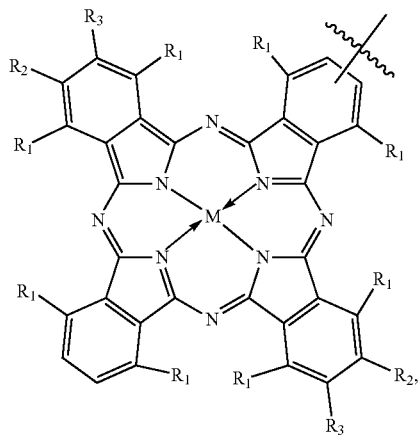

and a structural formula of the $R_b$ group is any one of

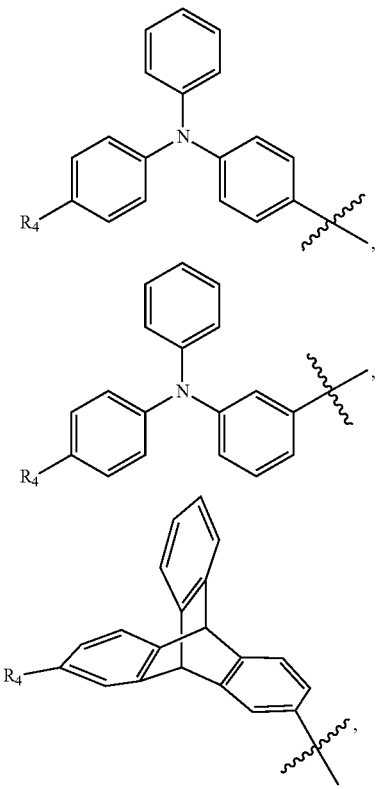

-continued

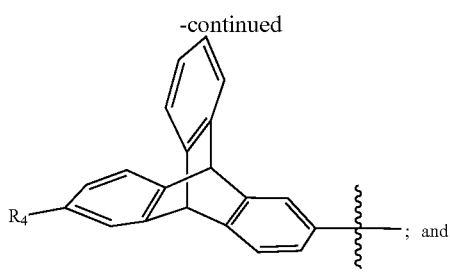
; and wherein M is any one of Zn, Cu, Ni, Co, or Fe, and $R_1$ group, $R_2$ group, $R_3$ group and $R_4$ group are each any one of halogen group, ketone group, aldehyde group, carboxyl group, alkyl group, sulfonate group, or nitrate group.

2. The three-dimensional dye according to claim 1, wherein a structural formula of the $R_4$ group is any one of

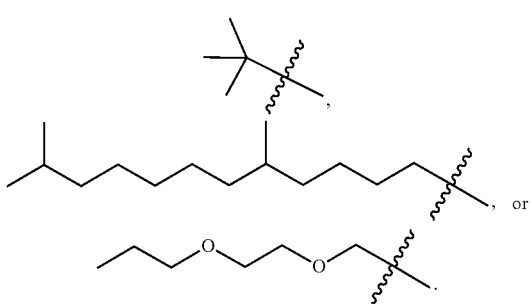

3. The three-dimensional dye according to claim 1, wherein the structural formula of the $R_a$ group is any one

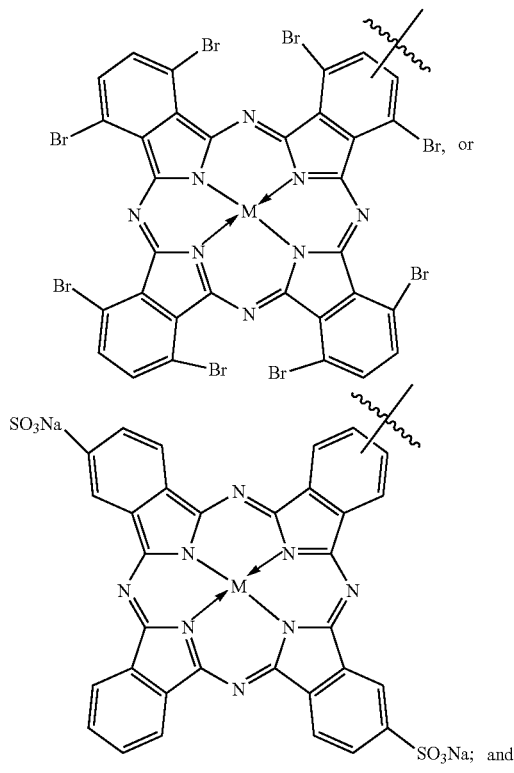

wherein M is any one of Zn, Cu, Ni, Co, or Fe.

4. A manufacturing method of a three-dimensional dye, comprising steps of:

providing a first reactant, the first reactant is a compound comprising an $R_a$ group, a structural formula of the $R_a$ group comprises

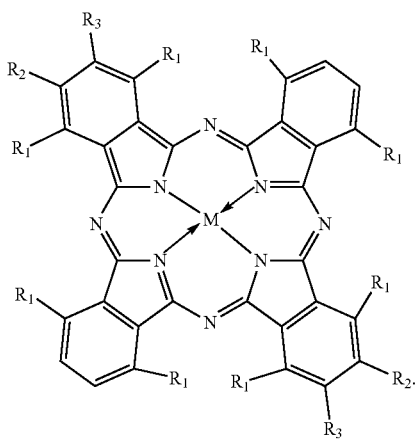

wherein $R_1$ group, $R_2$ group, and $R_3$ group are each any one of halogen group, ketone group, aldehyde group, carboxyl group, alkyl group, sulfonate group, or nitrate group, and wherein M is any one of Zn, Cu, Ni, Co, or Fe;

providing a second reactant, the second reactant is a compound comprising an $R_b$ group, a structural formula of the $R_b$ group comprises any one of

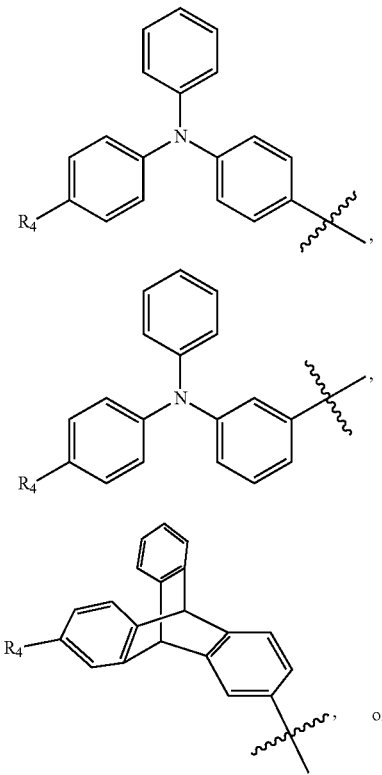

-continued

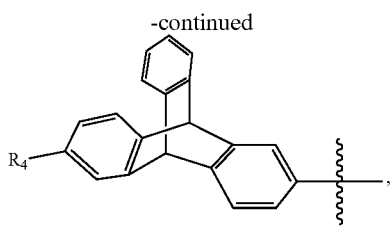

wherein R₄ group is any one of halogen group, ketone group, aldehyde group, carboxyl group, alkyl group, sulfonate group, or nitrate group; and reacting the first reactant with the second reactant to produce a three-dimensional dye, wherein a structure formula of the three-dimensional dye is $R_a$-$R_b$.

5. The manufacturing method of the three-dimensional dye according to claim 4, wherein the step of providing the first reactant further comprises:

providing a first precursor, wherein the first precursor is reacted to obtain the first reactant; and wherein a structural formula of the first precursor is

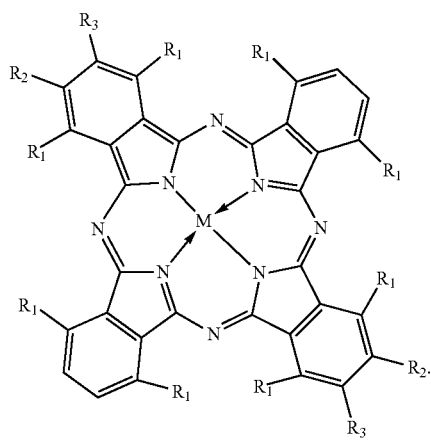

6. The manufacturing method of the three-dimensional dye according to claim 5, wherein the first precursor is reacted in a first solvent having a first additive to obtain the first reactant; wherein the first solvent comprises one of ester solvent, ether solvent, halogenated hydrocarbon solvent, alcohol solvent, amide solvent, halogenated alkane solvent, or a combination thereof, and the first additive comprises phosphorous chloride.

7. The manufacturing method of the three-dimensional dye according to claim 6, wherein a structural formula of the first precursor is

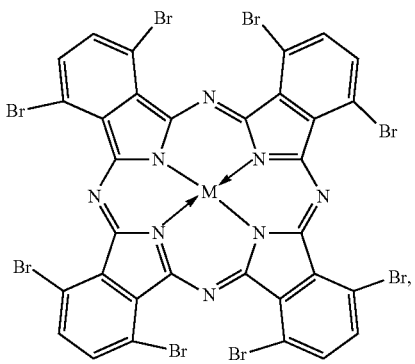

the first solvent is N,N-dimethylformamide (DMF), and the first additive is phosphorus oxychloride.

8. The manufacturing method of the three-dimensional dye according to claim 4, wherein the step of providing the second reactant further comprises:

providing a second precursor, wherein the second precursor is reacted to obtain the second reactant;

wherein a structural formula of the second precursor is

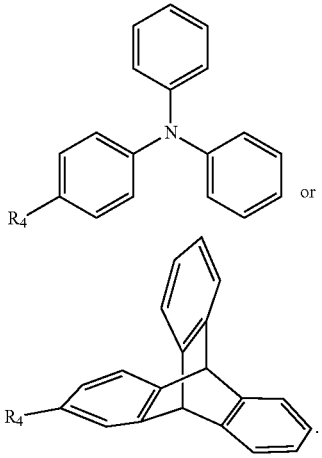

9. The manufacturing method of the three-dimensional dye according to claim 8, wherein the second precursor is reacted in a second solvent having a second additive to produce the second reactant; wherein the second precursor is reacted in a second solvent having a second additive to obtain the second reactant; wherein the second solvent comprises one of ester solvent, ether solvent, halogenated hydrocarbon solvent, alcohol solvent, amide solvent, halogenated alkane solvent, or a combination thereof, and the second additive comprises One of phosphorous chloride, borohydride, phosphorus compound, or a combination thereof.

10. The manufacturing method of the three-dimensional dye according to claim 9, wherein the second additive comprises any one of phosphorus oxychloride, sodium borohydride, triphenylphosphine dibromide, or a combination thereof.

11. The manufacturing method of the three-dimensional dye according to claim 10, wherein the structural formula of the second precursor is

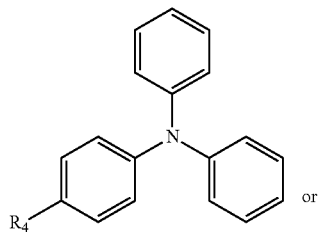

or

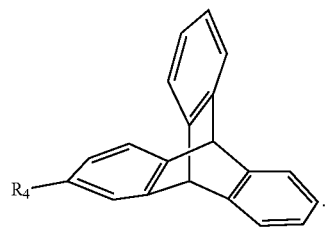

12. The manufacturing method of the three-dimensional dye according to claim 4, wherein the first reactant and the second reactant are reacted in a third solvent having a catalyst to obtain the third reactant; wherein the third solvent comprises one of ester solvent, ether solvent, halogenated hydrocarbon solvent, alcohol solvent, amide solvent, halogenated alkane solvent, or a combination thereof, and the catalyst comprises a basic type catalyst.

13. The manufacturing method of the three-dimensional dye according to claim 12, wherein the third solvent is chloroform, and the catalyst is 1,8-diazabicycloundec-7-ene.

14. A photoresist mixture, comprising: a three-dimensional dye, an adhesive resin, a photoinitiator, a polymerizable monomer, a solvent, and an adjuvant, wherein a structural formula of the three-dimensional dye is $R_a$-$R_b$, wherein a structural formula of the $R_a$ group is

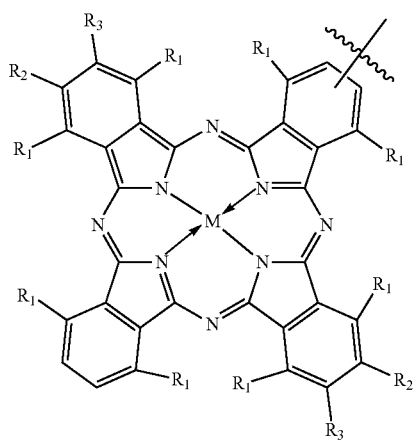

and a structural formula of the $R_b$ group is any one of

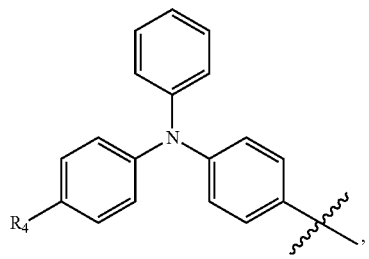

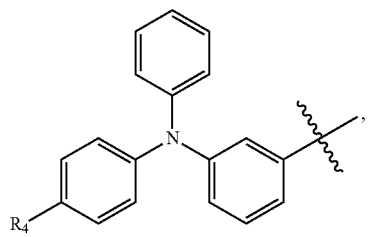

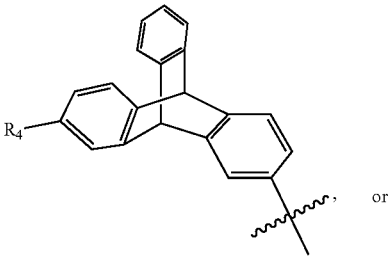

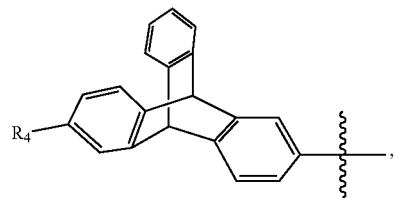

wherein M is any one of Zn, Cu, Ni, Co, or Fe, and $R_1$ group, $R_2$ group, $R_3$ group, and $R_4$ group are each any one of halogen group, ketone group, aldehyde group, carboxyl group, alkyl group, sulfonate group, or nitrate group.

15. The photoresist mixture according to claim 14, wherein the structural formula of the $R_4$ group is any one of

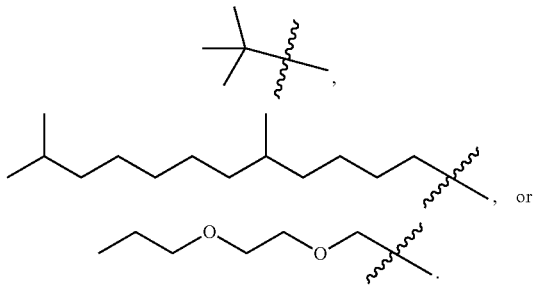
, or

16. The photoresist mixture according to claim 14, wherein the structural formula of the $R_a$ group is any one of

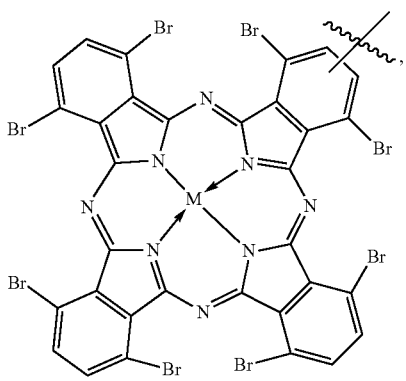

or

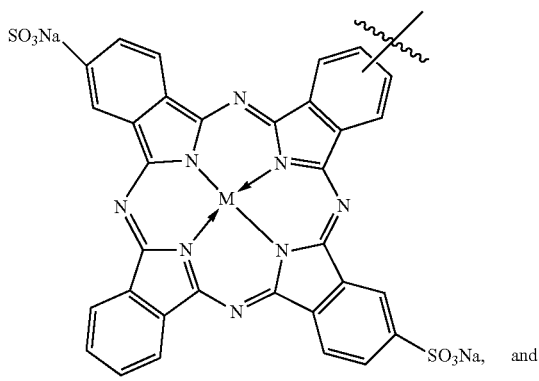

wherein M is any one of Zn, Cu, Ni, Co, or Fe.

17. The photoresist mixture according to claim 14, wherein a mass percentage of the three-dimensional dye is 10%46%, a mass percentage of the adhesive resin is 5%-8%, and a mass percentage of the photoinitiator is 0.2%46%, a mass percentage of the polymerizable monomer is 5%-8%, a mass percentage of the solvent is 70%-80%, and a mass percentage of the adjuvant is 0.1%-0.2%.

18. The photoresist mixture according to claim 14, wherein the adhesive resin is acrylic resin, the photoinitiator is a benzophenone compound, and the polymerizable monomer is acrylate of polyhydric alcohol, and the solvent is propylene glycol methyl ether acetate.

19. The photoresist mixture according to claim 14, wherein the adjuvant comprises one of dispersant, leveling agent, thermal polymerization inhibitor, foam inhibitor, or a combination thereof.

20. The photoresist mixture according to claim 19, wherein the adjuvant is a dispersant, and the dispersant is a polystyrene-polyacrylic acid di-block copolymer material.

* * * * *